US006884740B2

(12) United States Patent
Hu et al.

(10) Patent No.: US 6,884,740 B2
(45) Date of Patent: Apr. 26, 2005

(54) PHOTOELECTROCHEMICAL UNDERCUT ETCHING OF SEMICONDUCTOR MATERIAL

(75) Inventors: Evelyn L. Hu, Goleta, CA (US); Andreas R. Stonas, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 16 days.

(21) Appl. No.: 10/234,535

(22) Filed: Sep. 3, 2002

(65) Prior Publication Data

US 2003/0045120 A1 Mar. 6, 2003

Related U.S. Application Data

(60) Provisional application No. 60/317,419, filed on Sep. 4, 2001.

(51) Int. Cl.[7] .............................................. H01L 21/00
(52) U.S. Cl. ....................................... 438/962; 216/103
(58) Field of Search ............................... 438/708, 746, 438/962, 52, 733, 739; 156/643.1; 205/666; 216/2, 13, 94, 99, 96, 100, 103, 106, 108

(56) References Cited

U.S. PATENT DOCUMENTS

| | | | | |
|---|---|---|---|---|
| 5,279,702 A | * | 1/1994 | Douglas | ....................... 216/94 |
| 5,460,687 A | * | 10/1995 | Douglas | ....................... 216/94 |
| 5,773,369 A | | 6/1998 | Hu et al. | |
| 5,895,223 A | * | 4/1999 | Peng et al. | .................. 438/752 |
| 6,245,687 B1 | * | 6/2001 | Barsky et al. | .............. 438/746 |
| 6,445,009 B1 | * | 9/2002 | Grandjean et al. | .......... 438/962 |
| 6,468,902 B2 | * | 10/2002 | Kawai | ........................ 438/708 |

OTHER PUBLICATIONS

R. P. Strittmatter et al, Fabrication of FaN Suspended Microstructures, Applied physics Letters, vol. 78 No. 21, May 21, 2001.

* cited by examiner

*Primary Examiner*—Evan Pert
*Assistant Examiner*—Lisa Kilday
(74) *Attorney, Agent, or Firm*—Fulbright & Jaworski (57) ABSTRACT

Photoelectrochemical (PEC) etching is restricted to a group III nitride semiconductor-barrier interface to laterally etch or undercut the target group III nitride. The barrier interface is provided by the transparent sapphire substrate on which the target group III nitride is epitaxially grown or by a layer of material in intimate contact with the target group III nitride material and having a bandgap sufficiently high to make it resistant to PEC etching. Due to the first orientation in which this effect was first observed, it has been named backside-Illuminated photoelectrochemical (BIPEC) etching. It refers to a preferential etching at the semiconductor-barrier layer interface. The assembly can be exposed to light from any direction to effectuate bandgap-selective PEC etching. An opaque mask can be applied to limit the lateral extent of the photoelectrochemical etching.

15 Claims, 11 Drawing Sheets

- 44
- Etch resistant material — 36
- 38
- Etch susceptable material — 32
- 40
- Etch resistant material (e.g. substrate) — 34
- 42

Gallium Nitride cantilevers bend upward upon relaxation, indicating an as-grown strain gradient of 665 m$^{-1}$

Figure 7D

A - D — GaN Cantilevers
1 - 4 — tnGa N/GaN Cantilevers

Figure 8C  Membrane Resonant Response

Figure 9

Figure 10A - cantilever

Figure 10B - airbridge

Figure 10C – membrane

Figure 10D - perforated membrane legend for figure 10

□ base of structure

▦ areas solid through to the base of the structure

▤ areas with an etched air gap separating the top from the base

PHOTOELECTROCHEMICAL UNDERCUT ETCHING OF SEMICONDUCTOR MATERIAL

CROSS REFERENCE TO RELATED APPLICATIONS

This application claims the benefit of U.S. Provisional Application No. 60/317,419, filed Sep. 4, 2001, and which is incorporated herein by reference.

STATEMENT REGARDING FEDERALLY SPONSORED RESEARCH OR DEVELOPMENT

This invention was made with Government Support under Contract No. 14-96-1-1215, awarded by the Office of Naval Research. The Government has certain rights in this invention.

BACKGROUND OF THE INVENTION

1. Field of the Invention

This invention relates in general to a method of processing a semiconductor wafer, and more particularly, to a photoelectrochemical etching process.

2. Description of Related Art

There has been impressive progress in the growth of high quality GaN epitaxial layers and in their utilization for high performance optical devices. The group III nitrides hold great promise as the basis for a variety of high performance optoelectronic and electronic devices. GaN-based materials are well known for their large inherent strains, high piezoelectric constants and exceptional optical performance, making them outstanding candidates for microelectromechanical and microoptoelectromechanical systems (MEMS and MOEMS).

Implementation of such technology will require the availability of effective processes to carry out rapid lateral etching to form undercut structures. However, the group III nitrides are distinguished by their unusual chemical stability, making it difficult to identify reliable and controllable wet etchants. With other semiconductor materials, etching permits control over both the geometry and morphology of the material to be shaped. Purely chemical etches can often be tuned by variation of concentration, temperature, or other factors to produce etches which are in turn crystallographic, or isotropic. Current or voltage can also be used as a means of controlling electrochemical etching.

Recently, the absorption of light by a semiconductor (and the subsequent chemical alterations this induces) has been exploited to provide further control over etches. In some cases, such as the group III nitrides, it has even permitted etches in material for which no other practical wet etches exist. Hu et al U.S. Pat. No. 5,773,369 (the teachings of which are incorporated herein by reference) describes the photoelectrochemical (PEC) wet anisotropic etching of group III nitrides. Most etch processes show the most rapid etching taking place in regions where there is the largest common surface between semiconductor material and etchant. PEC etching in semiconductors is a photo-driven etch process where etching takes place in areas where there is both sufficient accretion of long-lived electron-hole pairs in the semiconductor material, and contact with etchant.

The benefits of PEC etching are numerous. Other anisotropic etches function either by ion-bombardment mechanisms, which produce damage in the semiconductor, or by selective etching of certain crystallographic facets, which limits the shape of the final device to the crystallographic planes of the material. Clearly either case has aspects which may not be favorable for the fabrication of an arbitrary device. PEC etching's anisotropy, however, derives from the control of the requisite above-bandgap illumination. This means that one may easily produce straight, low-damage side walls rapidly and inexpensively. However, while such a strong and rapid anisotropy may be useful for mesa- or via-etching, it does not provide undercut etching. Indeed, U.S. Pat. No. 5,773,369 sought to provide side walls while avoiding undercutting.

However, there are many cases in which undercut etching is highly desirable. These include the complete removal of devices from their substrates, as well as the partial separation of two layers, in structures such as those used for MEMS.

Presently GaN and other group III nitrides are grown on substrates made of sapphire or silicon carbide, which provide a suitable crystal lattice for epitaxial (atomically matched) crystal growth. However these substrates create or worsen many problems in the final device.

One such problem that is made worse is thermal resistance. The substrate acts as a thick, heat-blocking layer, which prevents the heat from being drawn away from the device. In order for the heat tolerant GaN device to be more effectively used, it must be removed from the heat-blocking substrate that could roast the apparatus that the GaN device is used in, or alter the device operation.

The substrate can also block electrical conduction. When devices are produced on electrically insulating substrates like sapphire and some kinds of silicon carbide, it prevents the back side from being used as one of the device contacts, a common practice in other material systems.

Because these substrates are very hard and quite chemically inert, it is difficult to lift off the GaN device or remove it through decomposition of the substrate in a conventional etching processes. The ability to lift the group III nitride device off the substrate would enable its use in a wider variety of high power, high temperature, and high frequency device applications.

Another much-needed tool is the ability to selectively undercut certain regions of a wafer, and leave other parts attached. This would permit the substrate to be used as a structural support only where desired, and allow the Gallium Nitride structure to move and flex where it had been freed. This ability is fundamental to the fabrication of small-scale mechanical structures known as microelectromechanical systems, or MEMS. Currently, MEMS are fabricated from metal, or silicon or other semiconductors. However, until this invention, there was no way to fabricate MEMS structures from the group III nitrides, which have properties that can provide very distinct effects in these structures.

SUMMARY OF THE INVENTION

The present invention solves the foregoing problems by restricting PEC etching to a semiconductor-barrier interface to laterally etch or undercut the target semiconductor. The barrier interface can be provided by the substrate (e.g., sapphire) with which the target semiconductor is intimately connected, e.g., by being formed epitaxially on the substrate, or by a layer of material in intimate contact with the target semiconductor material and having a bandgap sufficiently high to make it resistant to PEC etching.

In one embodiment of the invention, where a non-light absorbing (i.e. transparent) substrate is the only barrier layer, light exposure to effectuate the PEC etching is through the substrate, which results in restricting etching to the semiconductor-barrier layer interface. Such a process results in the name back-side-illuminated photoelectrochemical process, or BIPEC.

In other embodiments of the invention, each lateral site of the semiconductor material is in intimate contact with barrier material to form two interfaces of barrier material and target semiconductor material. It has been found that such assemblies can be exposed to light from any direction, top, bottom, side, or at any angle, to effectuate bandgap-selective PEC etching.

The present invention enables the ready lift-off of semiconductor devices, which is particularly useful when the substrate is sapphire or other inert material. Significantly the present invention provides a geometry that can produce strong undercuts and new morphologies, enabling the fabrication of a variety of MOEMS and MEMS not heretofore practical with group III nitrides. Lateral and undercutting etching of the PEC method of the present invention has resulted in the fabrication of group III nitride cantilever and membrane structures not heretofore available. The present invention can enable the construction of dynamically tunable transitions on a device scale and can be applied in a variety of devices, including transistors (e.g., HEMTs), light emitters (e.g., LEDs, lasers), and detectors. Strains on the order of $10^{-4}$ produce a very small energy shift, on the order of a few meV. The inventors are aware of no other examples of strain-tuned device structures, in any material system.

Because of the otherwise intractable nature of the group III nitrides, most examples described in the present specification cited are concerned with the group III nitrides. However, the geometry is applicable to semiconductors in general.

DETAILED DESCRIPTION OF THE INVENTION

Certain terms as used herein have the following meanings:

"Intimate contact" is used herein to refer to contact where there is too small a gap for electrolyte to easily penetrate.

"PEC" is an acronym for photoelectrochemical, used to refer to a photoelectrochemical wet anisotropic etching process or to the photoelectrochemical etch solution.

"Etch susceptible material" as used herein is semiconductor material that will be etched in a photoelectrochemical wet anisotropic etching process under the conditions of the process.

"Etch resistant material" as used herein is semiconductor material that will not be etched in a photoelectrochemical wet anisotropic etching process under the conditions of the process.

"Target", for example as used in "target semiconductor material" or "target group II nitride", refers to that semiconductor material etched in a PEC etching process.

"Barrier material" as used herein refers to any material that has the crystallographic or physical properties needed to enable an intimate connection to the target material. It can be a completely inert substrate such as sapphire, or may be an etch resistant material, obtained by suitable doping of semiconductor material.

"BIPEC" is an acronym for back-side-illuminated photoelectrochemical process. It refers to a PEC etch geometry where etching of the target is predominantly lateral due to being restricted through intimate contact with an etch-resistant barrier. Note that this can apply regardless of the angle or direction of illumination with respect to the crystal.

"Conventional" or "top-down" PEC processing as used herein refers to a planar Photoelectrochemical process which begins at the exposed plane of the wafer surface, and proceeds in a principally vertical manner.

"Microelectromechanical systems", or "MEMS" as used herein refers to any integrated device containing electrical and mechanical systems such as, but not restricted to, cantilevers, airbridges, and membranes which undergo mechanical stress or strain during their operation.

"Microoptoelectromechanical systems" or "MOEMS" as used herein refers to a subclass of MEMS which interact with light (e.g., emit, absorb, or filter light) through optical, optoelectronic, or optomechanical means. For example, this would include the integration of lasers, light-emitting diodes (LEDs), photodetectors, or other optoelectronic devices into MEMS structures. The properties of these optical elements may or may not be altered during the operation of the MOEMS device.

Figure 1:
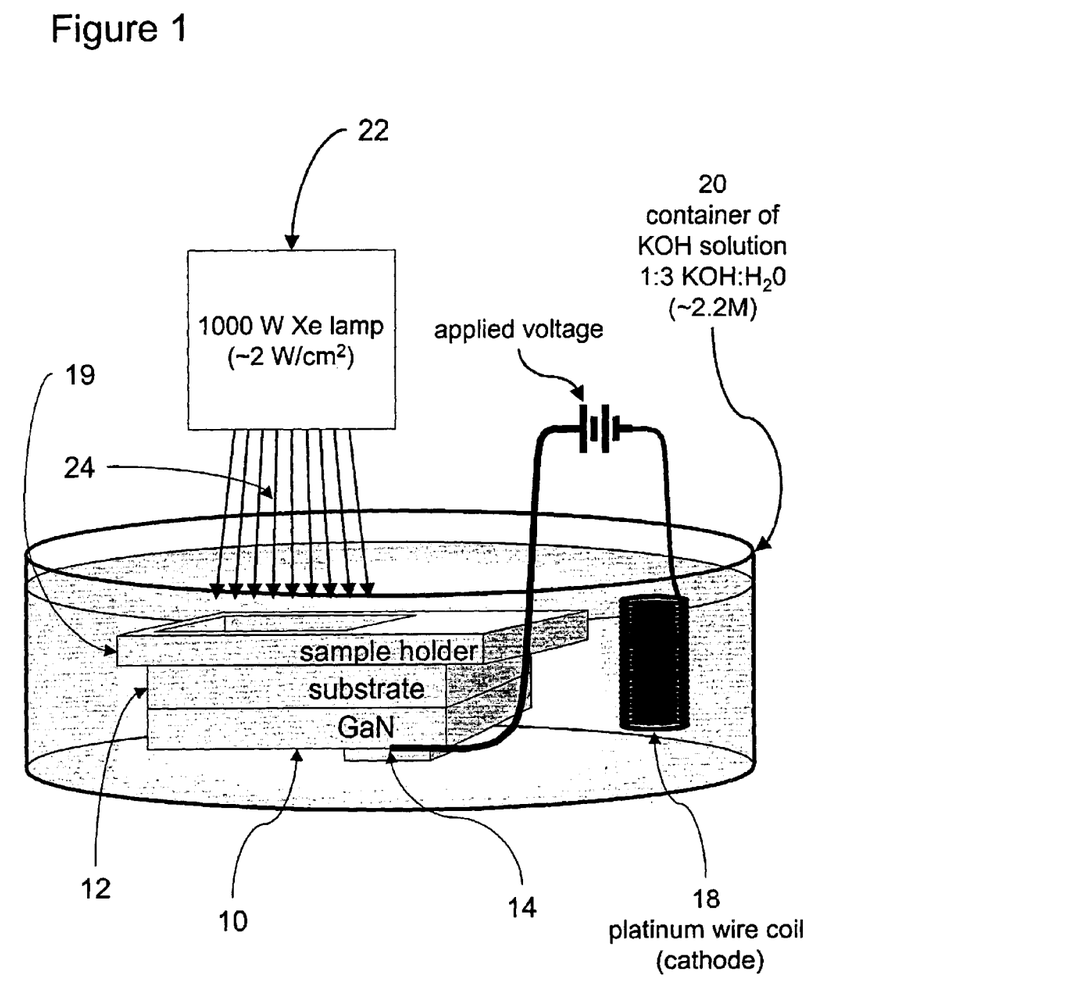
FIG. 1 is a schematic depiction of the etching apparatus of this invention.
Figure 2A:
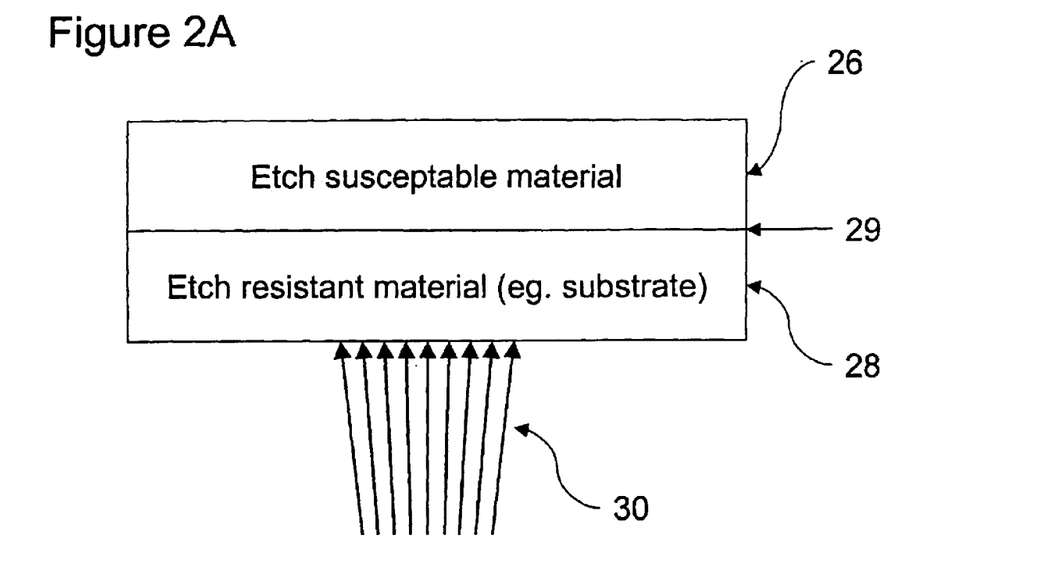
FIGS. 2a and 2b are a material schematic depiction and a scanning electron micrograph of the resulting etched self-assembled conical structures.
Figure 2B:
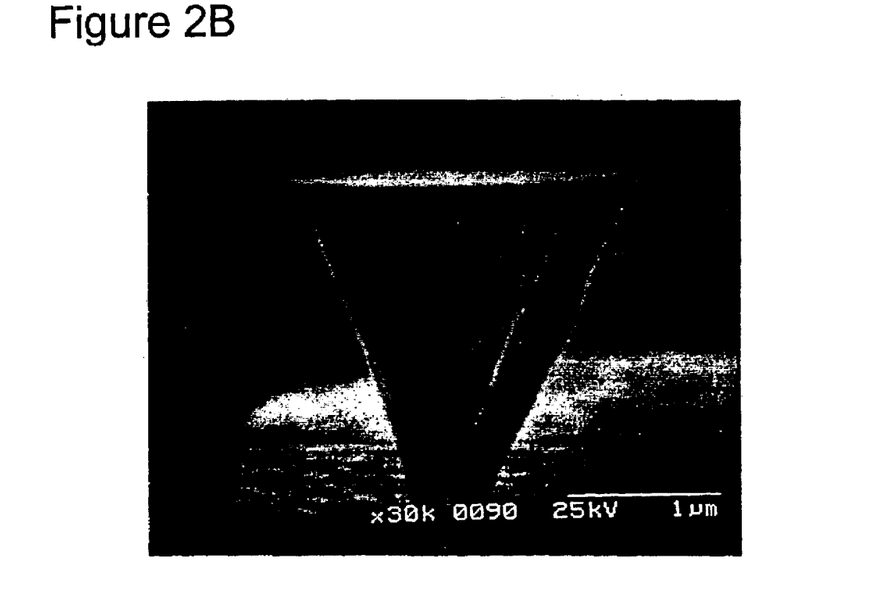
Figure 3A:
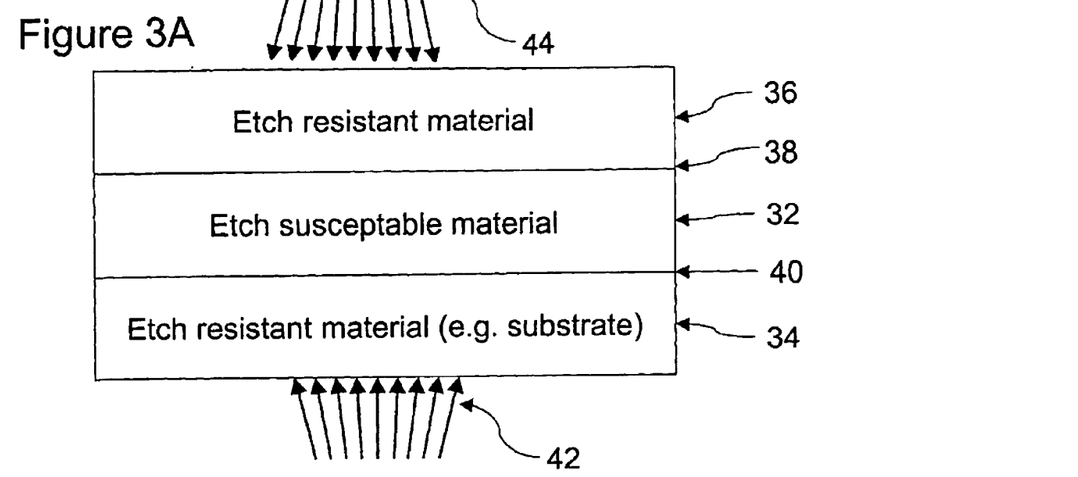
FIGS. 3a, 3b, and 3c are a material schematic depiction and scanning electron micrographs of resulting etched undercut structures.
Figure 3B:
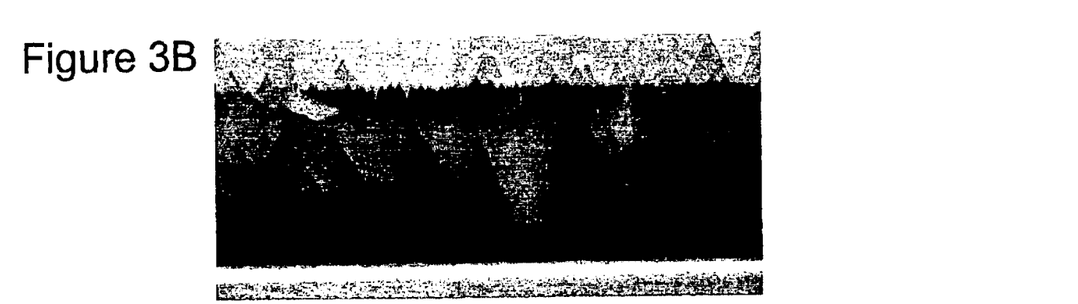
Figure 3C:
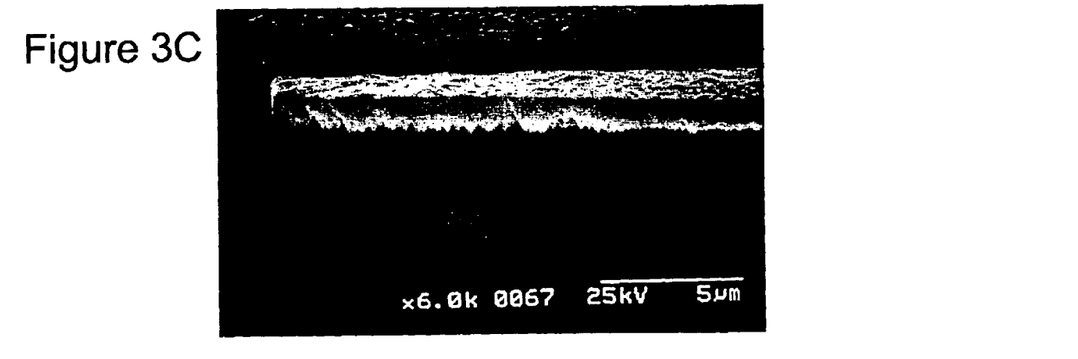

Conventional (top-down) PEC etching, is described in U.S. Pat. No. 5,773,369, and is an existing technology, which has been developed for a variety of materials, and has been most useful in direct bandgap semiconductors, such as gallium arsenide, and gallium nitride. This method enables the etching of otherwise inert chemistries, such as the etching of group III nitrides in KOH. It does not, however, allow one to form undercuts. By illuminating through an etch-resistant barrier, the present techniques enable one to achieve large lateral etch rates suitable for liftoff, i.e., removal of the overgrown material from the as-grown substrate, or the formation of structures exhibiting complex structures including morphologies that can vary much more widely than with conventional top-down PEC etching. Useful morphologies that can be produced enable the fabrication of inverted cones or spikes, or the formation of such devices as cantilevers and membranes. One can use either bandgap or dopant-selectivity to enhance the depth of the undercuts. The formation of undercuts, rough or smooth, enable one to increase the fraction of photons extracted from a light-emitting semiconductor A BIPEC process and its results are illustrated in FIGS. 1 to 3. The key difference between the conventional PEC etching process and the lateral BIPEC process is that in the lateral process, the light passes through a transparent layer in intimate contact with the semiconductor before it is incident upon the target semiconductor. For example, group III-nitrides are typically grown upon a substrate of sapphire. Because the electrolyte is restricted from penetrating between the sapphire and the group III nitride, the electron-hole pairs created by light incident upon this interface are not all free to immediately participate in the etching process. Thus, the key feature of BIPEC etching is illumination through a transparent (i.e., non-optically absorbing) layer in intimate contact with the material to be etched whereby dominant etching takes place at the interface between the transparent layer and the material to be etched.

Referring specifically to FIG. 1, in conducting a BIPEC process, the target semiconductor 10, in this case gallium nitride (GaN), is grown epitaxially on a transparent substrate 12, which is either an insulator, or a semiconductor with a higher direct band-gap than the semiconductor itself. In this case, the substrate 12 is formed of sapphire. Electrical contact 14 is made to the semiconductor, either through the deposition of metal, or by pressing a wire firmly against the semiconductor as shown, retained by a mounting clip 16, which can formed of Teflon. This electrical contact is connected to an electron sink, which may be either an external cathode 18, a metal which will serve as a cathode, or a chemically distinct region of the semiconductor which acts as a cathode. The connection may be made either directly, as shown in FIG. 1, or through a power supply (bias source), e.g., to the positive plate, and from the negative plate, of a battery as depicted in U.S. Pat. No. 5,773,369, or through a current meter, or both.

The sample is immersed into an etchant solution 20 which would not normally etch the target semiconductor significantly in the absence of light. For example, the group III nitrides may use solutions with either Potassium Hydroxide (KOH) or Hydrochloric Acid (HCl), as described in U.S. Pat. No. 5,773,369. In this particular example, a 1:3 KOH:$H_2O$ solution, about 2.2 molar, is used. The sample is oriented with respect to a light source 22 (i.e. lamp or laser) such that the incident radiation 24 must pass through the high-bandgap or insulating substrate 12 of the assembly before illuminating the target semiconducting material 10 to be etched. The light source is then activated, and material is etched. An illumination aperture 19 can be applied to limit undercutting to one side of the target material 10.

The morphology of the etch depends on the material structure, the etchant concentration, the bias, and the intensity of illumination. The preferred direction of illumination depends on whether only one lateral side or each lateral side of the layer of target semiconductor material is in intimate contact with barrier material; i.e., whether there is one or two interfaces of barrier material and target semiconductor material. In FIGS. 1, 2A and 2B, where there is only one barrier material interface, the application of incident light through the transparent substrate resulted in the micrograph of FIG. 2B. With structures illustrated in FIGS. 3, 4, 5 and 6, it has been found that the direction of light can be from either top or bottom, indeed from any direction. In these figures, no etchant solution is shown, but one can use etchant solution, connection, voltage bias and other implementations as shown with respect to FIG. 1 or in U.S. Pat. No. 5,773,369.

A schematic representation of the materials used in the simplest form of this invention is shown in FIG. 2A. In the assembly of FIG. 2A the target semiconductor material is composed entirely of etch susceptible material 26 (e.g., gallium nitride), grown directly on barrier material, a transparent substrate 28 (e.g., sapphire). There is one interface 29 of barrier material and target semiconductor material. Shining light 30 through the substrate 28 material can form an array of fused or individual inverted cones, similar to the ones shown in the photograph of FIG. 2B.

In the assembly shown in FIG. 3A, each lateral side of the layer of target semiconductor material 32, i.e., etch susceptible material, is in intimate contact with respective layers of barrier material 34 and 36 to form two interfaces, respectively 38 and 40 of etch resistant barrier material and etch susceptible target semiconductor material. One of the barrier material layers 34 can be a substrate formed of sapphire. The other barrier material layer 36 is formed of similar semiconductor material as the target material (e.g., group III nitride) differentiated from the target material 32 either by doping or bandgap from the target material 32. In this case, light can be applied to the substrate, as shown at 42 and/or to the etch resistant barrier layer 36 on the other side of the target material, as shown at 44, in which case the etch resistant barrier layer 36 should be transparent, or at least translucent, else, or additionally, light can be applied to the side or sides of the assembly, or at any angle. The etch results in an undercutting of the target material 32. Referring to FIG. 3B, first cones form then, with time, the undercut becomes deep, as shown in FIG. 3C. As it does so, the cones near the edge become smaller. Depending on selectivity of materials, it will eventually become smooth.

Figure 4A:
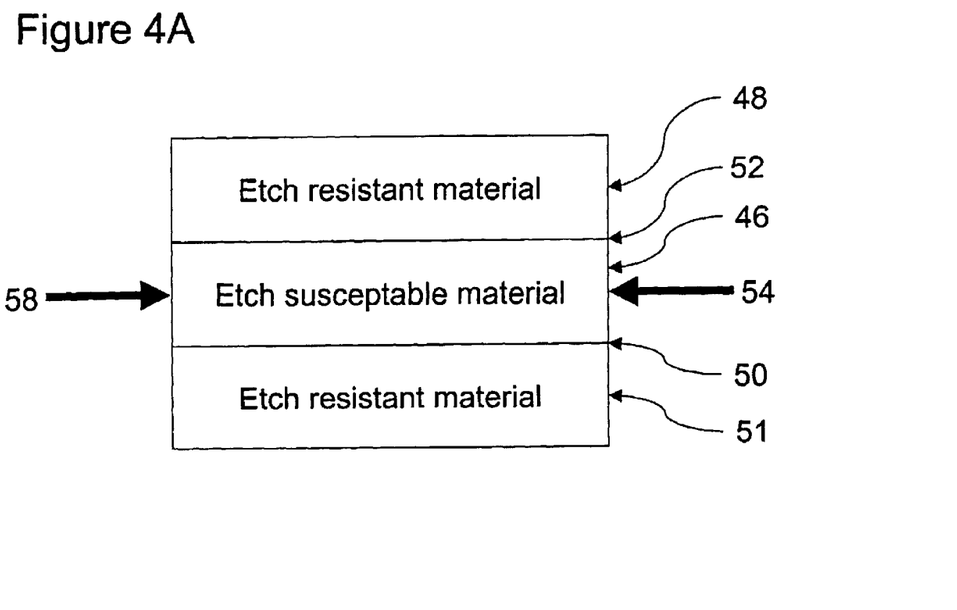
FIGS. 4a and 4b are schematic depictions of the undercutting morphology as observed in the case of group III nitride.
Figure 4B:
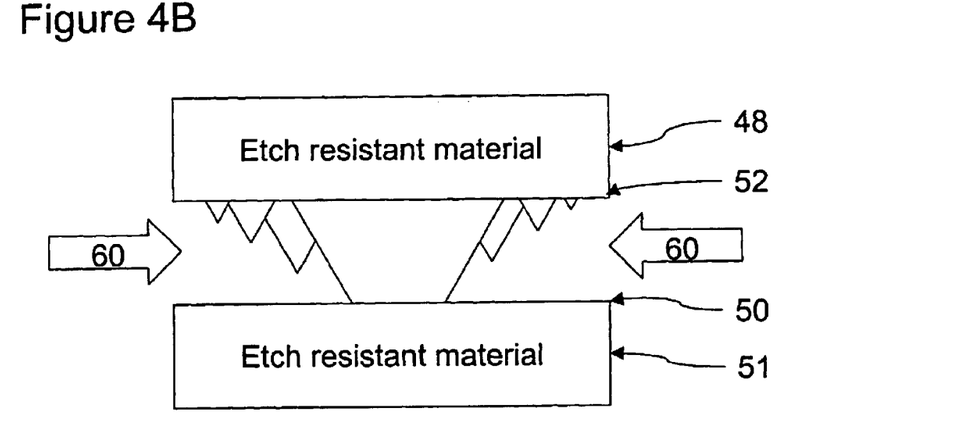

Referring to FIG. 4A, a layer 46 of etch susceptible target material is sandwiched between, and in intimate contact with, two layers 48 and 50 of etch resistant barrier material with one barrier layer 50 being formed on a non-etching substrate 51 (e.g., of sapphire). Two interfaces, respectively 52 and 54, are formed of etch resistant barrier material and etch susceptible target semiconductor material. Light is applied in the manner of FIG. 3A. As shown schematically in FIG. 4B, there are two directions of etching, indicated in FIG. 4A at 56 and 58, as light is applied. This etching results in undercutting from all exposed sides of the assembly, as shown at 60. Given time, the etch will fully remove the upper etch resistant layer 48, illustrating the use of BIPEC in a lift-off process.

Figure 5A:
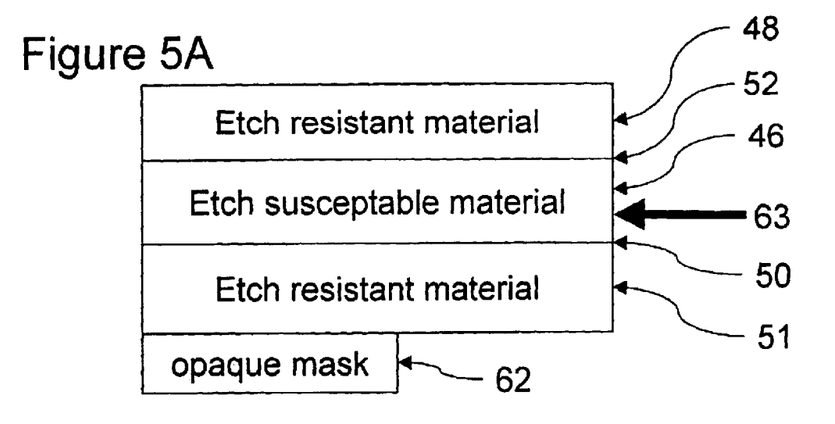
FIGS. 5a, 5b, and 5c are schematic depictions of a method to pattern the extent of the undercutting mechanism.
Figure 5B:
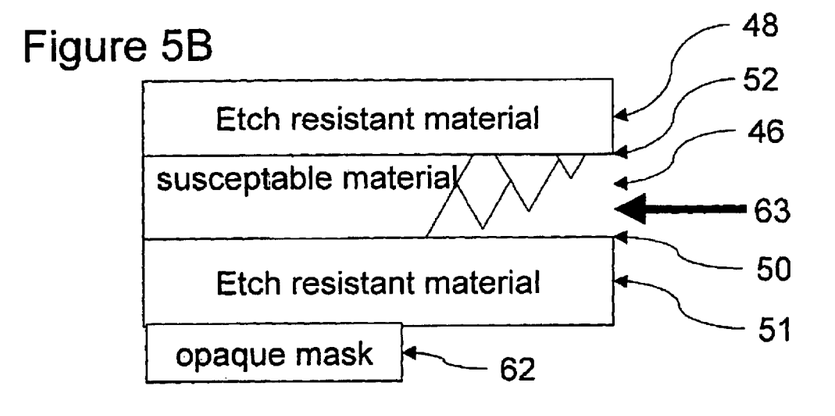
Figure 5C:
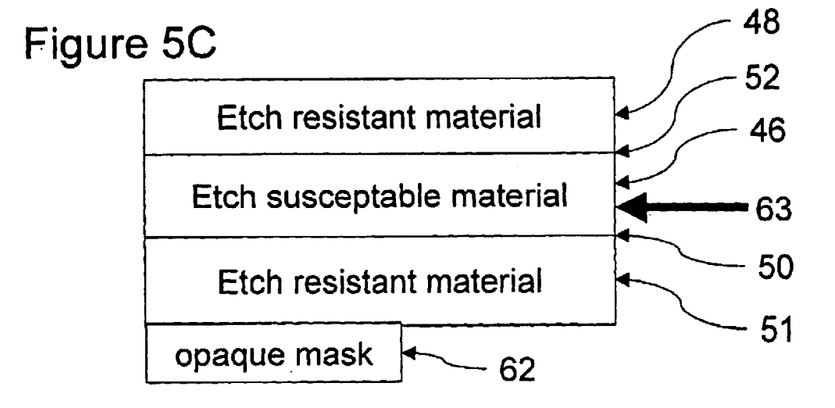

The structure of FIG. 5A is the same as for FIG. 4A, and light exposure is the same, except that an opaque pattern mask 62 is deposited on one or both of the etch resistant material surfaces. In the case shown, light is applied from the bottom of the assembly, and masked only on the bottom side. The opaque mask could be applied instead to the top surface of the top etch resistant barrier layer 48 with light being applied from the top. The etching occurs principally on the edge for which the light is not blocked by the mask, as shown at 63. As shown in FIGS. 5B and 5C, in this embodiment, the etch is progressively limited in its lateral depth by the opaque pattern.

The present invention has been illustrated primarily with gallium nitride as semiconductor material, either as etch susceptible target material, or doped sufficiently to be etch resistant barrier material. The nature of such doping to achieve levels of etch susceptibility is known to the art. In general the addition of impurities of silicon is employed to dope the material n-type, which makes it a more susceptible target when exposed properly, and magnesium impurities are used to make the material p-type, which generally makes it a more resistant barrier material. The mechanism does not depend on the impurities or dopants used, but instead depends on the resulting carrier concentration, mobility, and compensation. Other dopants can also be used.

The procedures and morphology herein are applicable to other group III nitrides, such as gallium nitride, indium nitride, aluminum nitride, and all possible alloys of these materials, eg. indium gallium nitride, aluminum gallium nitride, and the like. In particular embodiments, the target layer is InGaN and the barrier is GaN or AlGaN. In another embodiment, the target layer is GaN and the barrier is AlGaN. In a further embodiment, the group III nitride comprises a target layer of InGaN, and a barrier layer of InGaN with lower indium composition than the target layer. In a still further embodiment, the group III nitride comprises a target layer of AlGaN, and a barrier layer of AlGaN with higher aluminum composition than the target layer.

They are also applicable to semiconductor material more generally, such as gallium arsenide, indium arsenide, aluminum arsenide, indium phosphide, silicon, and the like.

They are also applicable to barrier material which is not single-crystal in nature. One may employ non-epitaxial barriers such as insulators deposited by evaporation, sputtering, chemical vapor deposition, and the like, so long as this material forms an intimate contact with the target material.

The invention is not restricted to material that is transparent, but allows for the possibility that one or both of the barriers be or translucent. As long as there is a pathway for light to reach the target semiconductor, the nature of the invention is retained. As such, one of the barriers may be opaque without altering the principle of the etch.

This invention also applies to target material regardless of its quality, purity, dislocation density, grain size. Even polycrystalline target layers could be used, as long as they etch in a photoelectrochemical manner.

The following examples will further illustrate the invention.

EXAMPLE 1

Figure 6:
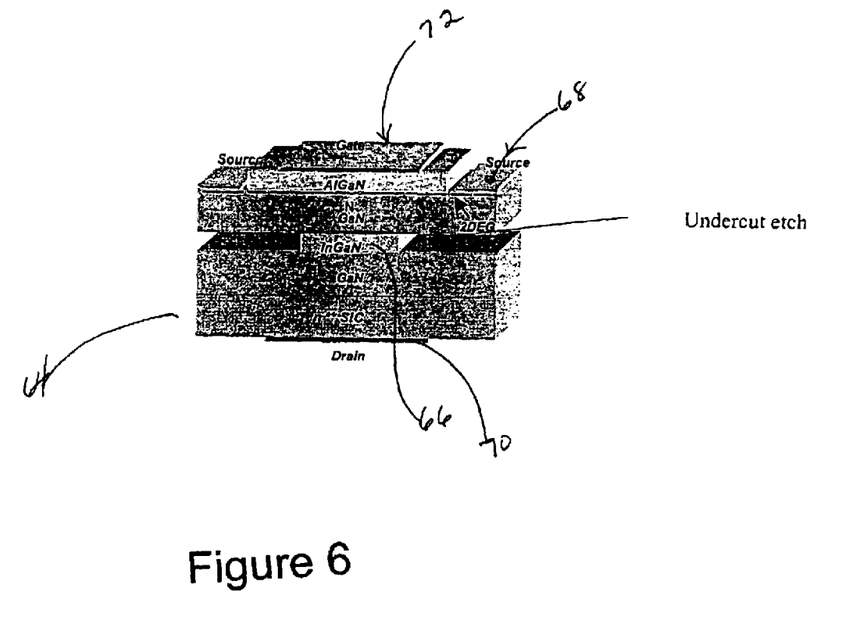
FIG. 6 is a schematic perspective view illustrating undercut etching of GaN for the fabrication of a GaN current apertured vertical field effect transistor (CAVET)

A Current Apertured Vertical Electron Transistor (CAVET) 64 is fabricated by the application of this invention to a target layer located just below the gate of a vertical transistor structure, as shown in FIG. 6. The structure is grown to include a target layer 66 of indium gallium nitride between the source 68 and the drain 70. This is then laterally etched using the techniques of this invention to produce the undercut structure shown in FIG. 6 The resulting aperture between the source 68 and the drain 70 enhances the pinch-off of the gate 72 by providing a highly insulating air-gap 74 which confines the current to the area below the gate 72, while retaining a larger area for use as source and drain contacts to either side of the aperture.

EXAMPLE 2

Cantilevers formed of gallium nitride are fabricated by including a target layer of indium gallium nitride in the growth of a thicker layer of gallium nitride. This is then patterned and etched by a vertical etch of prior art to define the area of the cantilever, and its supporting base. The indium gallium nitride layer is then partially etched by the technique shown in FIG. 5, using the mask 62 shown to define which areas are separated from the lower layer of gallium nitride. A broad range of conditions have been shown to be suitable for such an etch. In the case shown a KOH concentration of 2.2 molar was employed, as was a simple platinum-wire cathode, and a relevant illumination intensity of 2 watts per square centimeter.

Figure 7A:
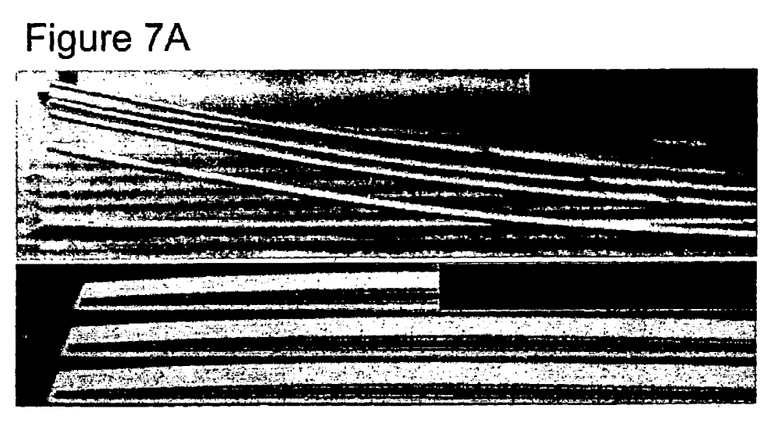
FIG. 7A is a scanning electron micrograph of GaN cantilevers fabricated in accordance with the present invention.
Figure 7B:
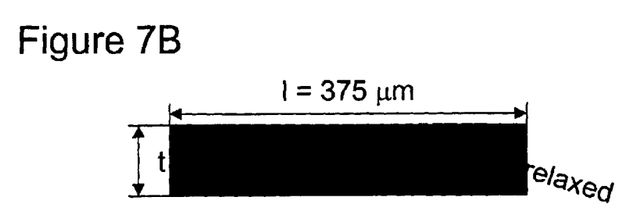
FIG. 7B is a schematic depictions of one of the cantilevers of FIG. 7A as it was first grown, before removal from the substrate. Relative tensile and compressive strains are labeled, treating the neutral axis as unstrained.
Figure 7C:
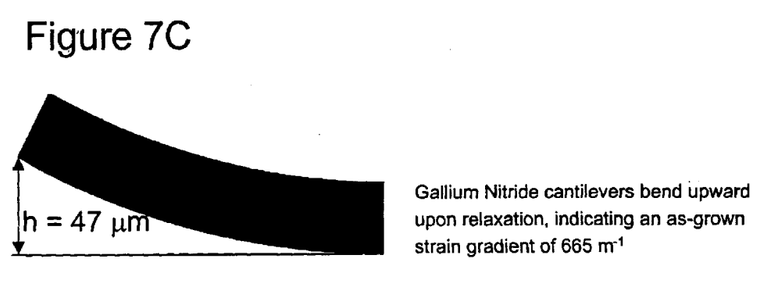
FIG. 7C is a schematic of the same cantilever after it has been separated from the substrate. The upward curvature shown is caused by relaxation of the strain field shown in 7B.

The resulting cantilevers are shown in a scanning electron micrograph in FIG. 7A, and schematically before and after lateral etching in FIGS. 7B and C respectively. The strain state in the as grown material is shown in 7B, It is the relaxation of this strain state that induces the upward curvature seen in FIGS. 7A and 7C. This curvature indicates that the as-grown strain gradient is 665 m$^{-1}$.

These cantilevers are simple, but fully functional MEMS devices. This can be verified by the application of a sinusoidal electric field to the cantilever. When the frequency of this excitation is varied, one obtains results similar to those shown in FIG. 7D, which clearly shows resonant frequencies corresponding to the resonant modes of the cantilevers.

EXAMPLE 3

Figure 7D:
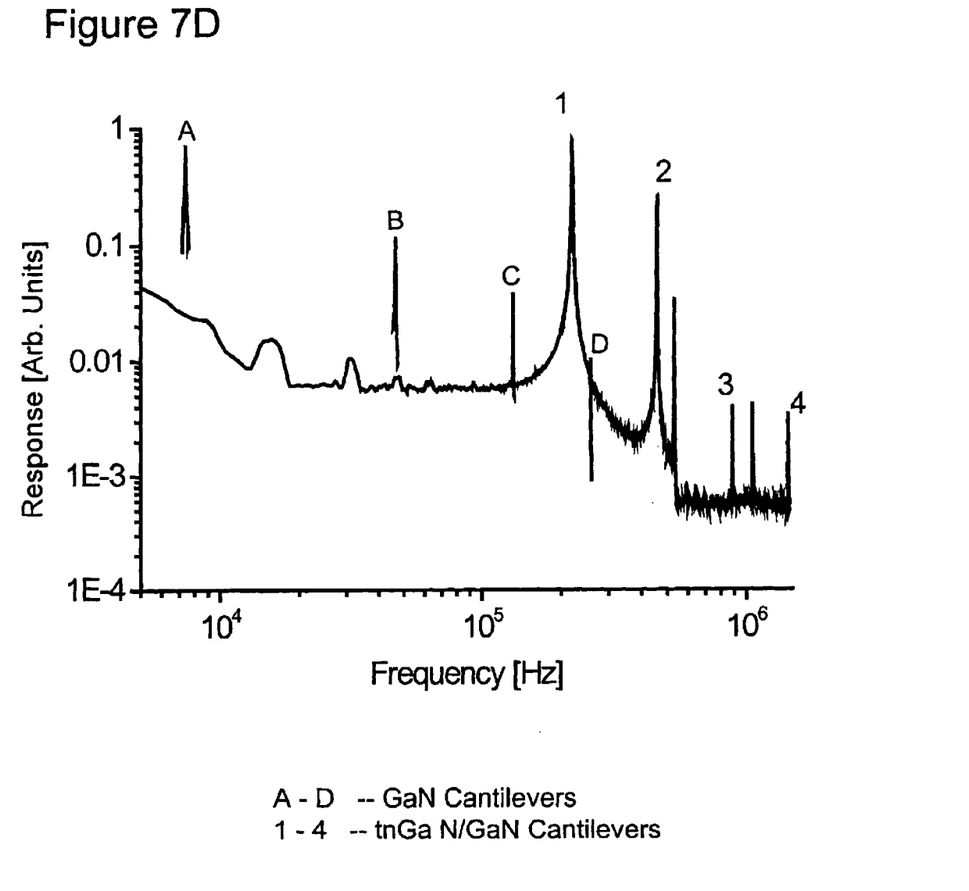
FIG. 7D are plots showing resonant responses of GaN and InGaN cantilevers fabricated in accordance with the present invention.

The procedure of Example 2 was followed but a thin layer of indium gallium nitride (a quantum well) was included near the top of the cantilever. Plots showing resonant responses of the fabricated GaN and InGaN cantilevers are shown in FIG. 7D, and are labeled InGaN/GaN cantilevers.

EXAMPLE 4

A membrane formed of material similar to that employed in either Example 2 or Example 3 is fabricated by the application of the same process, but using a different set of masks. First, an array of holes are made in the grown structure using a technique of prior art. Then a patterned lateral etch shown in FIG. 5 is employed. The mask in this case is simply a large open circle.

Figure 8A:
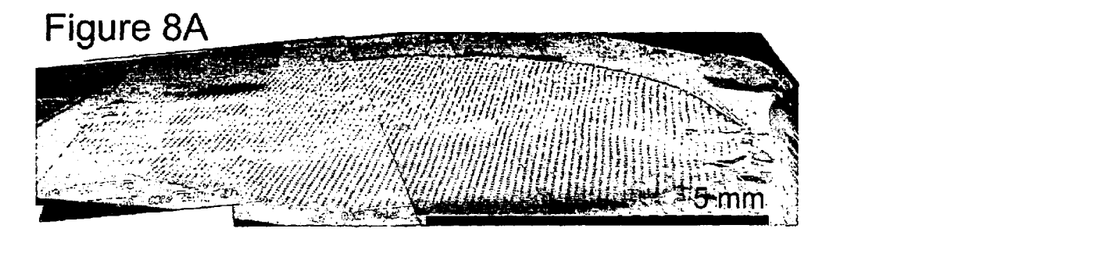
FIG. 8A is a photograph of a thin membrane fabricated in accordance with the present invention.
Figure 8B:
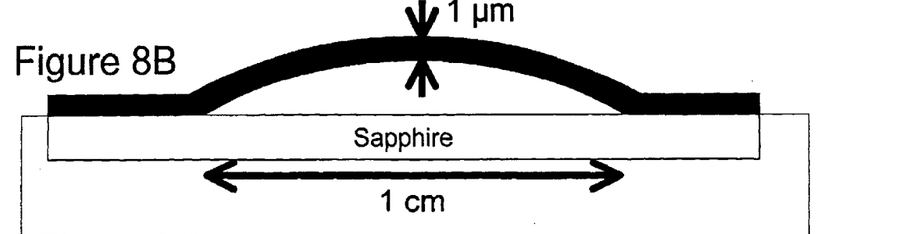
FIG. 8B is a schematic depiction of the membrane of FIG. 8A.
Figure 8C:
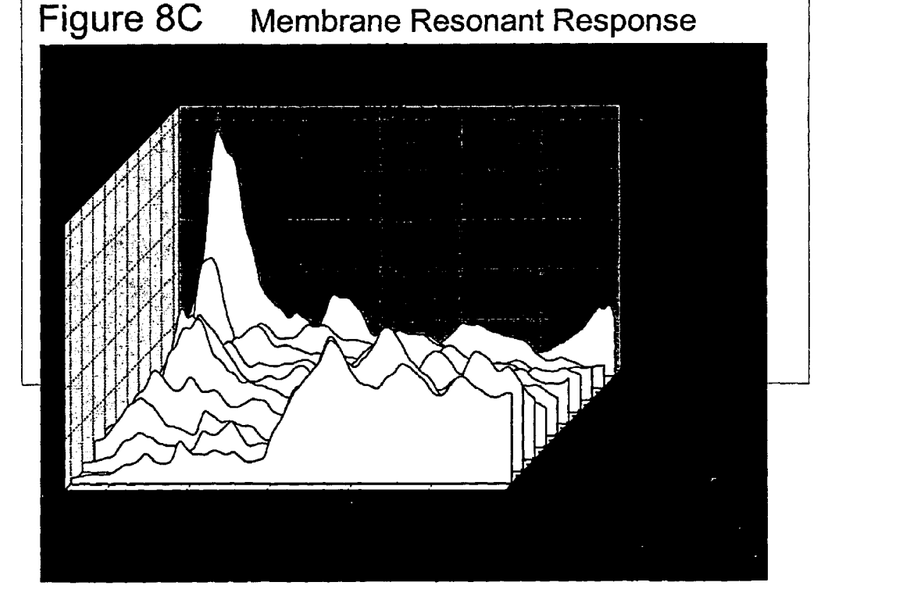
FIG. 8C is a plot showing the resonant response of the membrane of FIG. 8A.

The result is shown in FIG. 8A, and schematically in FIG. 8B, in which a membrane 1 μm in thickness and 1 cm in length was produced secured to its sapphire substrate. Biaxial strain is provided proportional to the membrane's surface area and inversely proportional to its thickness. A plot showing the resonant response of the membrane is shown in FIG. 8C.

While the present invention has been illustrated primarily using examples of dopant-selective undercut etching for simplicity of description, another more versatile incarnation is the preferential etching due to bandgap selective PEC etching, known as bandgap selective undercut etching. This is a uniquely powerful tool because the flexibility afforded the etch is much greater. While this has been performed before in a variety of materials systems, this invention is the first which performs such etching in the group III nitrides, which unlike other material systems lack any competing technique for producing such an etch.

In a further embodiment of the invention, there is a class of devices of particular interest which is made possible by this invention, and the techniques described herein. This is that class of devices in which the top, removed or partially removed layer, itself contains a heterostructure, or more particularly a quantum well. When such a structure is integrated into a cantilever, airbridge, membrane, or similar structure to form a MEMS or MOEMS device, it permits the properties of the heterostructure to be altered including but not restricted to luminescence energy, absorption cutoff, extraction efficiency, and the like, for example by subjecting it to stress during operation. Some or all of the optical properties of the MOEMS device can be altered by the stress state of the structure. Several of these devices may even be directly tunable by the application of a strain to the lifted-off structure. Stress can induce a change in the optical property of the quantum well, either directly or by causing a strain. In a particular embodiment, the device comprises at least a component in the form of a wafer and stress is applied in the plane of the wafer. In a further embodiment, the applied stress is biaxial. In a particular embodiment, the optical property that is altered is the emission spectrum. In another embodiment, the optical property that is altered is the absorption spectrum.

Figure 9:
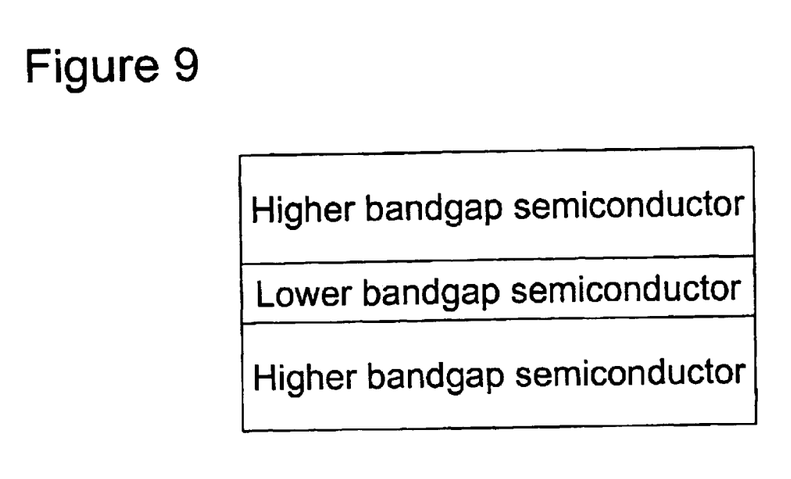
FIG. 9 is a schematic depiction of a quantum well.

By "heterostructure", we refer to any structure containing semiconductors with more than one bandgap, particularly due to a change in composition of the semiconductor, and more particularly when the transition between these materials maintain some degree of crystallographic alignment as created in epitaxial growth. "Quantum well" is used herein to refer to any heterostructure in which a lower bandgap semiconductor exists between two semiconductors of higher bandgap, particularly when the thickness of the lower bandgap material is less than 150 nm, and more particularly when it is less than 10 nm. A schematic is shown in FIG. 9.

By "bandgap selective PEC etching", we refer to etching which occurs preferentially in a lower bandgap material compared to a higher bandgap material because the photon energy of the requisite light is predominantly between the bandgaps of a lower bandap material and a higher bandgap material. In contrast, "dopant selective undercut etching" refers to etching in which the etch proceeds laterally due to the selective PEC etching of a semiconductor with one polarity of doping, eg. n-type, located between, and in intimate contact with, two semiconductors of the opposite polarity of doping, eg. p-type. "Bandgap selective undercut etching" or "bandgap selective lateral etching" refer to etching in which the etch proceeds laterally due to the bandgap selective PEC etching of a lower bandgap material located between, and in intimate contact with, two higher bandgap materials.

The various embodiments shown in FIG. 10 illustrate the use of bandgap selective undercut etching in the present invention. A plan view of a cantilever, i.e., a piece of material suspended by one end, is shown in FIG. 10A. a [plan view of an airbridge is shown in FIG. 10B. As used herein "airbridge" refers to a piece of material suspended between two opposite ends, particularly where each end is supported by a single region of support material.

Figure 10A:
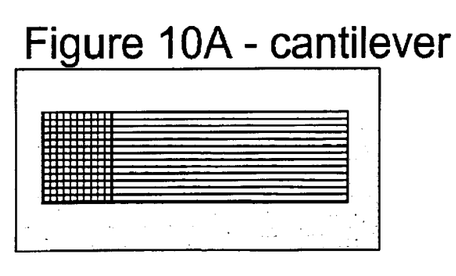
FIG. 10A is a schematic plan view depiction showing an example of a cantilever.
Figure 10B:
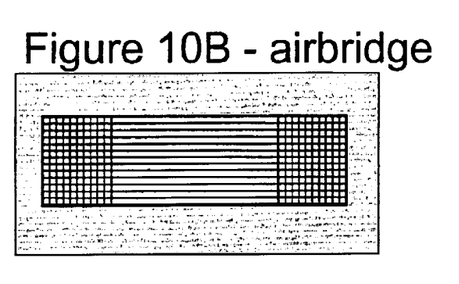
FIG. 10B is a schematic plan view depiction showing an example of an airbridge.
Figure 10C:
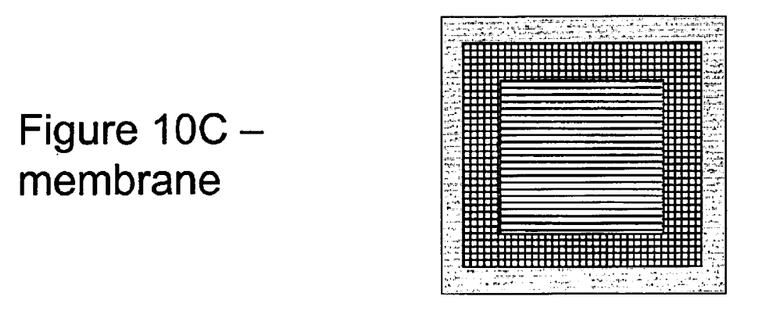
FIG. 10C is a schematic plan view depiction showing an example of a membrane.
Figure 10D:
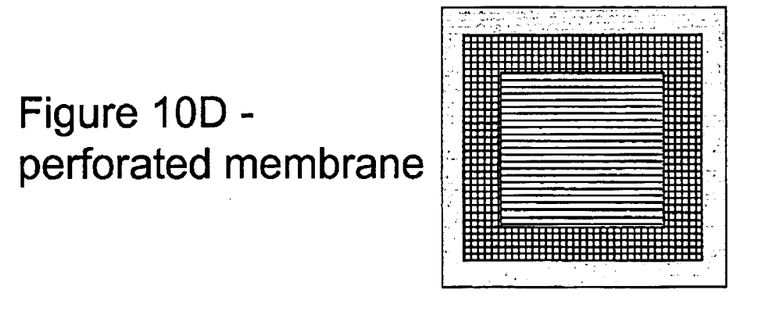
FIG. 10D is a schematic plan view depiction showing an example of a perforated membrane.

A plan view of a membrane is shown in FIG. 10C. "Membrane" as used herein refers to a piece of material suspended on its circumference. This includes structures which have been singly or multiply perforated by holes through their thickness. A plan view of a perforated membrane is shown in FIG. 10D.

Although the present invention and its advantages have been described in detail, it should be understood that various changes, substitutions and alterations can be made herein without departing from the spirit and scope of the invention. Moreover, the scope of the present application is not intended to be limited to the particular embodiments of the invention as described. As one of ordinary skill in the art will readily appreciate from the disclosure of the present invention, means presently existing or later to be developed that perform substantially the same function or achieve substantially the same result as means used in the embodiments described herein may be utilized according to the present invention. Accordingly, the invention is intended to include such means within its scope.

What is claimed is:

1. A method of wet etching a layer of target semiconductor material, comprising:
providing at least one lateral side of said layer of target semiconductor material in intimate contact with at least one barrier material to form at least one interface of barrier material and target semiconductor material;
immersing the target semiconductor material and barrier material in a solution capable of etching the target semiconductor material under photoelectrochemical conditions and not capable of etching the barrier material under said photoelectrochemical conditions; and
illuminating the semiconductor material with light having a frequency above the energy bandgap of the target semiconductor material in a manner whereby to restrict photoelectrochemical etching to said interface, said light having sufficient energy to photoelectrochemically laterally etch the target semiconductor material at said interface.

2. The method of claim 1 wherein said barrier material is a transparent or translucent substrate on which the layer of target semiconductor material is epitaxially grown, and the semiconductor material is illuminated only through the substrate.

3. The method of claim 2 wherein the target semiconductor material is a group III nitride.

4. The method of claim 3 wherein the substrate is formed of sapphire.

5. The method of claim 1 wherein each lateral side of said layer of target semiconductor material is in intimate contact with barrier material to form two interfaces of barrier material and target semiconductor material.

6. The method of claim 5 wherein the semiconductor material is illuminated from above, from below, from one or both of the sides, or from an angle thereto.

7. The method of claim 5 wherein the barrier material on one lateral side of the target semiconductor material is a transparent or translucent substrate and the barrier material on the other lateral side of the target semiconductor material is semiconductor material having a higher energy band gap than the target semiconductor material.

8. The method of claim 5 wherein the barrier material each lateral side of the target semiconductor material is semiconductor material having a higher energy band gap than the target semiconductor material.

9. The method of claim 8 wherein the barrier material on one lateral side of the target semiconductor is in intimate contact with a transparent or translucent substrate.

10. The method of claim 1 in which an opaque mask is applied to the outer surface of the barrier material to limit the lateral extent of the photoelectrochemical etching.

11. The method of claim 7 in which an opaque mask is applied to the outer surface of the substrate to limit the lateral extent of the photoelectrochemical etching.

12. The method of claim 8 in which an opaque mask is applied to the outer surface of the semiconductor barrier material to limit the lateral extent of the photoelectrochemical etching.

13. A method of wet etching a layer of target group III nitride semiconductor material, comprising:

providing at least one lateral side of said layer of target semiconductor material in intimate contact with at least one barrier material to form at least one interface of barrier material and target semiconductor material;

immersing the target semiconductor material and barrier material in a solution capable of etching the target semiconductor material under photoelectrochemical conditions and not capable of etching the barrier material under said photoelectrochemical conditions; and illuminating the semiconductor material with light having a frequency above the energy bandgap of the target semiconductor material in a manner whereby to restrict photoelectrochemical etching to said interface, said light having sufficient energy to photoelectrochemically laterally etch the target semiconductor material at said interface.

14. The method of claim 13 wherein the target semiconductor material is gallium nitride.

15. The method of claim 14 wherein the barrier material is formed of sapphire.

* * * * *